United States Patent
Tobin (10) Patent No.: US 9,929,029 B2
(45) Date of Patent: Mar. 27, 2018

(54) SUBSTRATE CARRIER SYSTEM

(71) Applicant: Applied Materials, Inc., Santa Clara, CA (US)

(72) Inventor: Jeffrey Tobin, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/292,680

(22) Filed: Oct. 13, 2016

(65) Prior Publication Data

US 2017/0110352 A1 Apr. 20, 2017

Related U.S. Application Data

(60) Provisional application No. 62/242,174, filed on Oct. 15, 2015.

(51) Int. Cl.
| | |
|---|---|
| *H01L 21/68* | (2006.01) |
| *H01L 21/67* | (2006.01) |
| *H01L 21/687* | (2006.01) |

(52) U.S. Cl.
CPC ........ *H01L 21/67201* (2013.01); *H01L 21/68* (2013.01); *H01L 21/68742* (2013.01); *H01L 21/68785* (2013.01); *H01L 21/68792* (2013.01)

(58) Field of Classification Search
CPC .............. H01L 21/67201; H01L 21/68; H01L 21/68742; H01L 21/68785; H01L 21/68792

See application file for complete search history.

(56) References Cited

U.S. PATENT DOCUMENTS

| | | | | |
|---|---|---|---|---|
| 5,516,367 A | * | 5/1996 | Lei | ........................ C23C 16/4412 |
| | | | | 118/725 |
| 5,974,681 A | * | 11/1999 | Gonzalez-Martin | |
| | | | | ........................ H01L 21/67034 |
| | | | | 34/58 |
| 6,063,196 A | * | 5/2000 | Li | ........................ C23C 16/4583 |
| | | | | 118/712 |

(Continued)

FOREIGN PATENT DOCUMENTS

| | | |
|---|---|---|
| JP | 2006005177 A | 1/2006 |
| KR | 20000053486 A | 8/2000 |
| KR | 20150088828 A | 8/2015 |

OTHER PUBLICATIONS

International Search Report and Written Opinion for Application No. PCT/US2016/056798 dated Dec. 14, 2016.

*Primary Examiner* — Kaitlin S Joerger
(74) *Attorney, Agent, or Firm* — Patterson + Sheridan LLP (57) ABSTRACT

Embodiments described herein relate to a substrate carrier system. The substrate carrier system includes a carrier for transferring a substrate within a multi-chamber processing system. The carrier may be placed in a load lock chamber for receiving the substrate, and the substrate is transferred to a processing chamber on the carrier. In the processing chamber, the carrier, with substrate, is disposed on a susceptor. The carrier can also enhance thermal control of the edge of the substrate in the processing chamber. The substrate carrier system further includes positioning features for repeatable positioning of the substrate in the processing chamber and repeatable positioning of the carrier in the load lock chamber and the processing chamber.

18 Claims, 12 Drawing Sheets

(56) References Cited

U.S. PATENT DOCUMENTS

| | | | | |
|---|---|---|---|---|
| 6,063,440 | A * | 5/2000 | Chen | C23C 16/44 118/715 |
| 6,120,609 | A * | 9/2000 | Selyutin | C23C 16/4583 118/500 |
| 6,146,463 | A * | 11/2000 | Yudovsky | C23C 16/4583 118/728 |
| 6,168,668 | B1 * | 1/2001 | Yudovsky | H01L 21/68 118/715 |
| 6,197,117 | B1 * | 3/2001 | Li | H01L 21/681 118/715 |
| 6,368,450 | B2 * | 4/2002 | Hayashi | H01L 21/68721 118/723 E |
| 6,695,546 | B2 * | 2/2004 | Lee | B65G 47/06 406/88 |
| 6,743,296 | B2 * | 6/2004 | Kao | C23C 14/56 118/500 |
| 7,115,840 | B2 * | 10/2006 | Lee | H01L 21/67109 118/724 |
| 7,242,204 | B2 * | 7/2007 | Otaguro | H01L 21/68 324/750.19 |
| 7,624,772 | B2 * | 12/2009 | Iwabuchi | C23C 16/4586 118/725 |
| 7,857,569 | B2 * | 12/2010 | Hiroki | H01L 21/68 414/217 |
| 8,136,564 | B2 * | 3/2012 | Nakamura | B32B 38/1841 156/381 |
| 8,280,545 | B2 * | 10/2012 | Kondoh | H01L 21/67748 700/214 |
| 8,314,371 | B2 * | 11/2012 | Sorabji | H01L 21/67115 219/444.1 |
| 9,355,876 | B2 * | 5/2016 | Reuter | H01L 21/6719 |
| 9,558,971 | B2 * | 1/2017 | Miyazaki | H01L 21/67051 |
| 9,593,419 | B2 * | 3/2017 | Balasubramanian | C23C 16/4584 |
| 2008/0295769 | A1 * | 12/2008 | Kawagoe | H01L 21/67259 118/696 |
| 2010/0039747 | A1 | 2/2010 | Sansoni et al. | |
| 2012/0171870 | A1 * | 7/2012 | Mitrovic | C23C 16/45504 438/706 |
| 2013/0337655 | A1 * | 12/2013 | Lee | H01J 37/32844 438/715 |
| 2015/0243542 | A1 | 8/2015 | Yoshihara et al. | |
| 2015/0258553 | A1 * | 9/2015 | Kobayashi | H01L 21/67028 427/372.2 |
| 2016/0314997 | A1 * | 10/2016 | Reuter | H01L 21/67201 |
| 2017/0110352 | A1 * | 4/2017 | Tobin | H01L 21/67201 |

\* cited by examiner

SUBSTRATE CARRIER SYSTEM

CROSS-REFERENCE TO RELATED APPLICATIONS

This application claims benefit of U.S. Provisional Patent Application Ser. No. 62/242,174, filed Oct. 15, 2015, which is incorporated herein by reference.

BACKGROUND

Field

Embodiments of the present disclosure generally relate to a system in semiconductor processing. More specifically, embodiments provided herein relate to a substrate carrier system.

Description of the Related Art

Semiconductor substrates are processed for a wide variety of applications, including the fabrication of integrated devices and microdevices. One method of processing substrates includes depositing a material, such as a dielectric material or a conductive metal, on an upper surface of the substrate. Epitaxy is one deposition process that is used to grow a thin, ultra-pure layer, usually of silicon or germanium on a surface of a substrate in a processing chamber. The fabrication of integrated devices and microdevices are typically done in a multi-chamber processing system that may include one or more load lock chambers, one or more transfer chambers, and one or more processing chambers. Transferring of the substrate within the multi-chamber processing system may be done by a substrate handling element, such as a robot. However, the substrate handling element may damage the backside of the substrate, forming scratches or defects on the backside of the substrate.

Therefore, there is a need for an improved system for minimize damages to the backside of the substrate.

SUMMARY

Embodiments of the present disclosure generally relate to a substrate carrier system. In one embodiment, a substrate carrier system includes a carrier disposed on a susceptor in a processing chamber. The carrier includes a top surface, a bottom surface, wherein a plurality of protrusions are formed on the bottom surface, an outer surface, and an inner surface, wherein the inner surface is angled with respect to the top surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a substrate carrier system. The substrate carrier system includes a carrier for transferring a substrate within a multi-chamber processing system. The carrier may be placed in a load lock chamber for receiving the substrate, and the substrate is transferred to a processing chamber on the carrier. In the processing chamber, the carrier, with substrate, is disposed on a susceptor. The carrier can also enhance thermal control of the edge of the substrate in the processing chamber. The substrate carrier system further includes positioning features for repeatable positioning of the substrate in the processing chamber and repeatable positioning of the carrier in the load lock chamber and the processing chamber.

Figure 1:
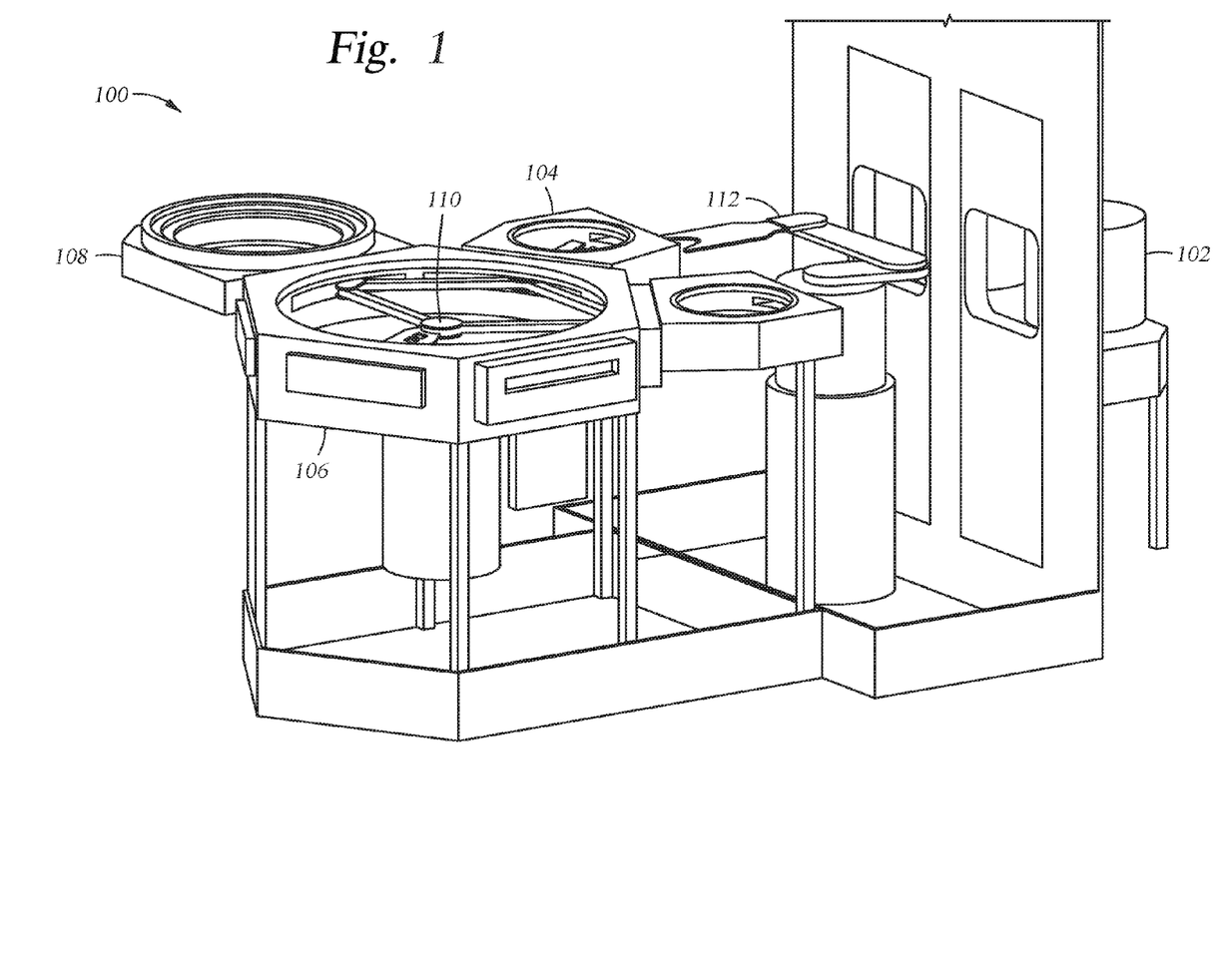
FIG. 1 is a schematic perspective view of a multi-chamber processing system according to one embodiment described herein.

FIG. 1 is a schematic perspective view of a multi-chamber processing system 100 according to one embodiment described herein. The multi-chamber processing system 100 may include one or more front opening unified pods (FOUPs) 102, one or more load lock chambers 104, at least one transfer chamber 106, and one or more processing chambers 108. A robot 110 may be disposed in the transfer chamber 106 for transferring substrates from load lock chambers 104 to the processing chambers 108, or vice versa. Another robot 112 may be disposed between the FOUPs 102 and the load lock chambers 104 for transferring substrates from the FOUPs 102 to the load lock chambers 104, or vice versa. The one or more processing chambers 108 may include a processing chamber for epitaxial deposition of materials on the substrate.

Figure 2:
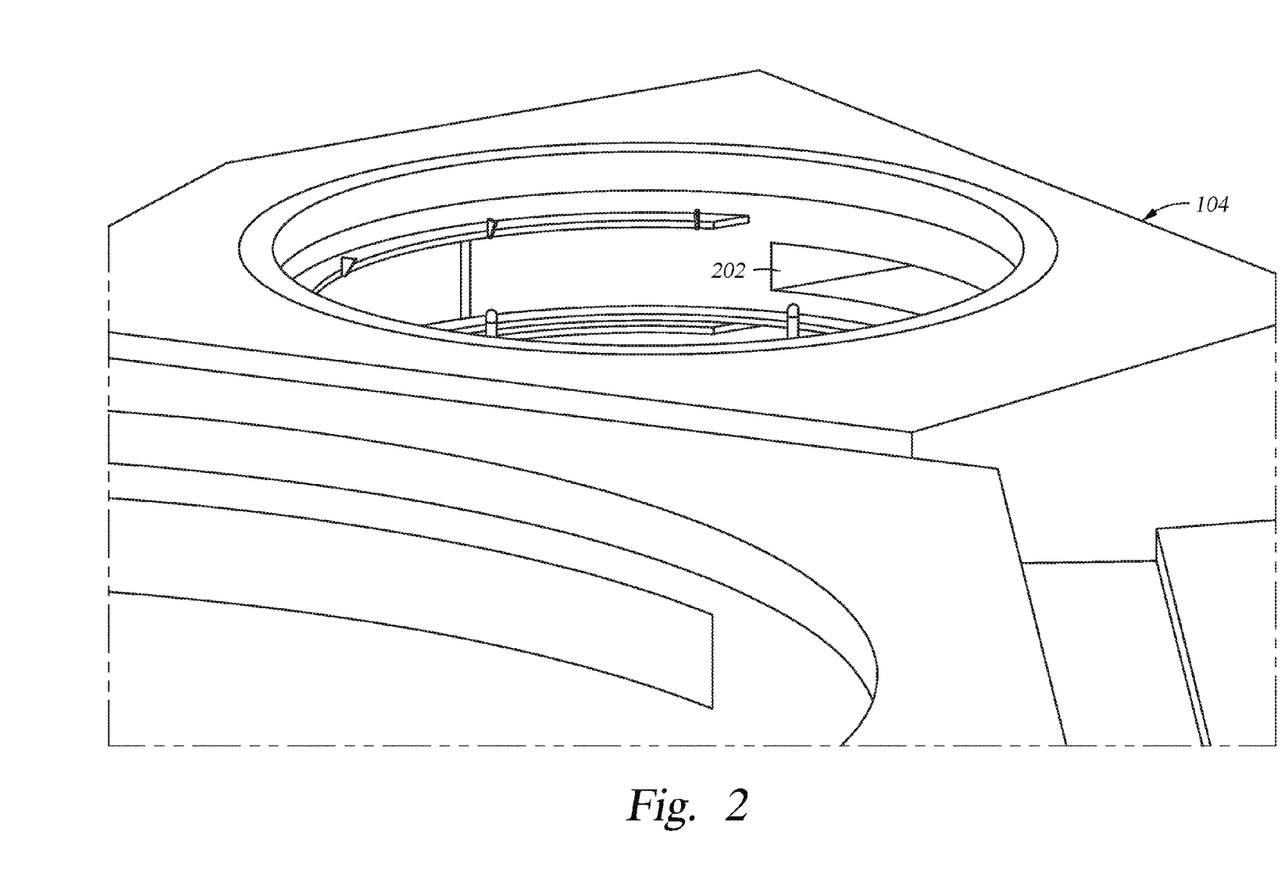
FIG. 2 is a schematic perspective view of a load lock chamber according to embodiments described herein.
Figure 4:
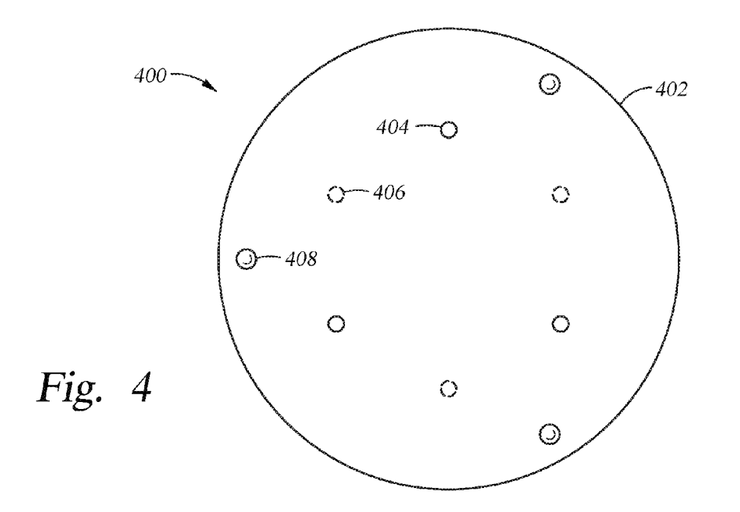
FIG. 4 is a bottom view of a carrier according to one embodiment described herein.

FIG. 2 is a schematic perspective view of one of the one or more load lock chambers 104 according to embodiments described herein. The load lock chamber 104 may include an alignment ring coupled to the chamber wall, one or more alignment pins coupled to the alignment ring, a plurality of lift pins, and an air puck. The plurality of lift pins may be tipped (perlast tipped), or made of a material that would not scratch the back side of the substrate. However, such pins cannot be used in many processing chambers, such as epitaxy chambers for example, because the material cannot withstand the processing environment in the processing chamber. A carrier, such as a carrier ring or platter, may be placed on a carrier shelf in the load lock chamber 104. The carrier shelf may be coupled to a bottom of the load lock chamber 104 or movably coupled to the chamber wall of the load lock chamber 104. As shown in FIG. 4, the carrier 402 may be circular and may be a platter that includes a plurality of openings 404. Referring back to FIG. 2, the alignment elements, such as the alignment ring and the alignment pins, may be used to align the substrate to the carrier in the load lock chamber 104 before placing the substrate onto the carrier. By utilizing the alignment elements along with aligning the carrier with the substrate disposed thereon in the processing chamber 108 with the susceptor, each substrate would be placed in the same place and orientation in the processing chamber 108. This could address one of the major contributors to non-uniformity both within substrate and substrate to substrate that is seen in epitaxial deposition.

Figure 3A:
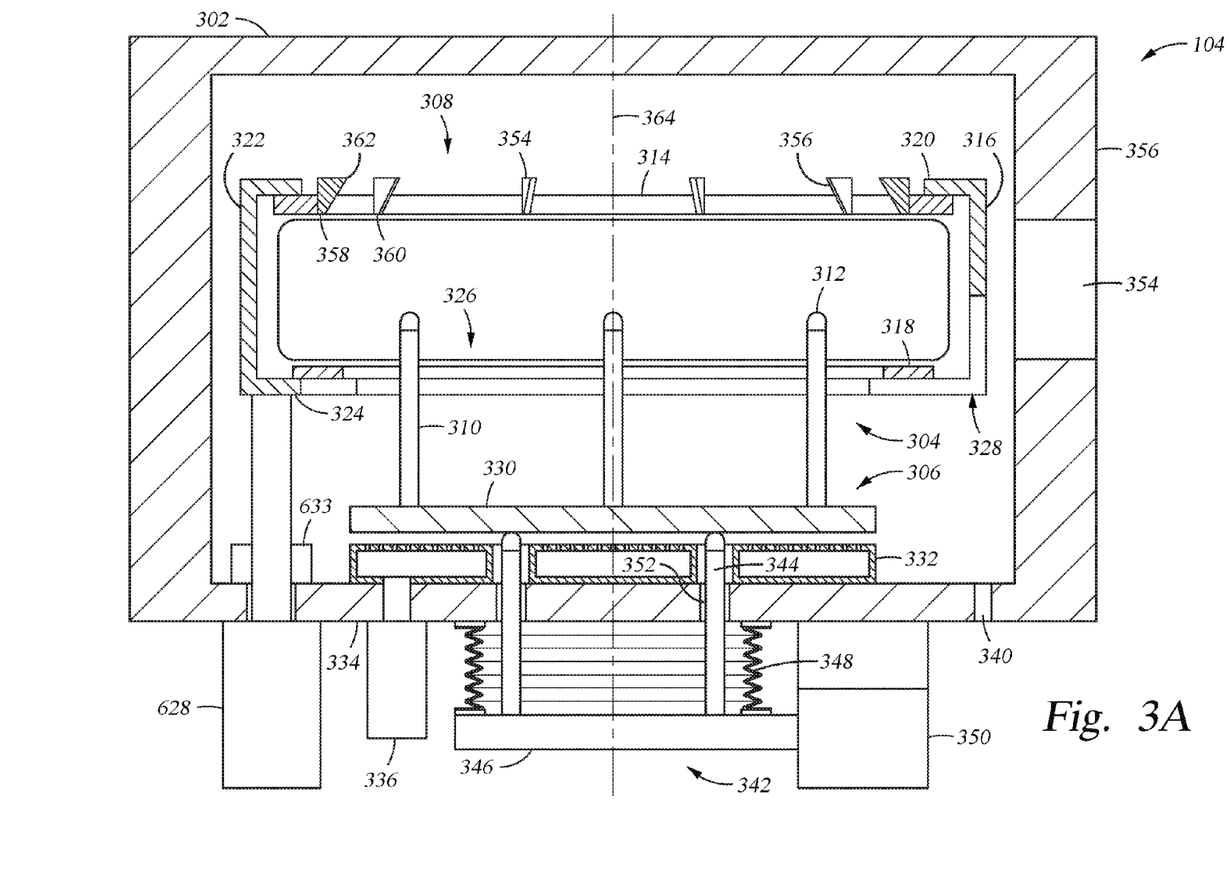
FIG. 3A is a schematic cross sectional view of the load lock chamber of FIG. 2.

FIG. 3A is a schematic cross sectional view of the load lock chamber 104. As shown in FIG. 3, the load lock chamber 104 further includes an air bearing base having an air bearing surface. During operation, the lift pins float on the air bearing surface. When the substrate is placed on the lift pins, the air generated by the air puck gently moves the substrate against alignment elements, such as the alignment ring and the alignment pins, which are rigidly coupled to the chamber wall. The alignment elements are always registered in the same place to the carrier by virtue of the carrier's locating features to the carrier shelf. Once the substrate would be aligned to the carrier, the air bearing would be locked and the lift pins would either drop or the carrier shelf and the carrier would be raised to pick up the substrate off the lift pins.

The load lock chamber 104 comprises a chamber body 302 defining an enclosure that houses a substrate handling assembly 304. The substrate handling assembly 304 includes a substrate positioning assembly 306 and an actuated alignment assembly 308 disposed around the substrate positioning assembly 306. The substrate positioning assembly 306 includes one or more support pins 310, each of which has a soft tip 312 for contacting the back of a substrate without scratching. The support pins 310 may be a structurally strong material, such as metal, quartz, or ceramic, and the tips 312 may be a polymeric material, for example a rubber material or other elastomeric material, such as PERLAST® (a perfluoroelastomer material available from Precision Polymer Engineering of Houston, Tex.).

Figure 3B:
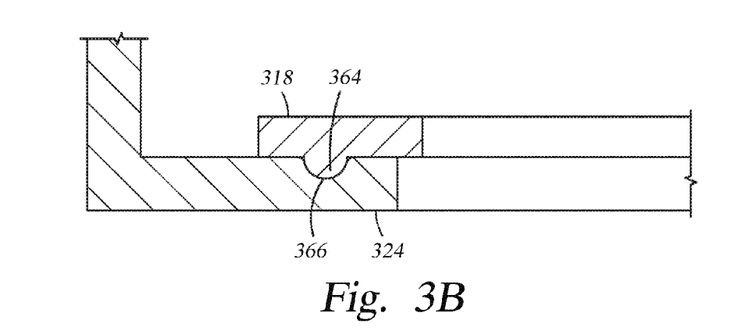
FIG. 3B is a detail view of a portion of the load lock chamber of FIG. 3A.

FIG. 3B is a detail view of the load lock chamber 104 of FIG. 3A. The alignment features of the carrier and shelf are shown. In FIG. 3B the alignment assembly 308 includes an alignment member 314, an alignment support 316, and a carrier 318. The alignment support 316 has an axial portion 322, a first extension 320, and a shelf 324. The first extension 320 extends radially inward from the axial portion 322 and connects to the alignment member 314. The shelf 324 also extends radially inward from the axial portion 322 and provides a staging place for the carrier 318. The carrier 318 and shelf 324 define an opening 326 through which the pins 310 extend to provide substrate handling and positioning. The axial portion 322 has a passage 328 through which a substrate may pass to enter and exit the load lock chamber 104. A passage 354 is also formed in a first wall 356 of the load lock chamber 104 to align with the passage 328.

The substrate positioning assembly 306 also includes a bearing plate 330 that supports the pins 310. The bearing plate 330 is a structurally strong member that may be flat or curved, but that provides a surface for extending the pins 310 to a position suitable for supporting and manipulating a substrate in the load lock chamber 104. The bearing plate 330 may be made of any suitable material, which may be the same material as the pins 310, or a different material. The bearing plate 330 may be quartz, ceramic, plastic, or metal, depending on the needs of specific embodiments. In some cases, the bearing plate is made of, or coated with, a material inert to gases generated by semiconductor wafers after processing. Such materials may include the materials listed above.

A gas cushion member 332 is disposed below the bearing plate 310, and may be disposed on, or attached to, a second wall 334 of the load lock chamber 104. A gas source 336 provides gas through a gas conduit 338 into the gas cushion member 332, and a pumping port 340 removes gas from the load lock chamber 104. The flow of gas through the gas cushion member 332 provides a gas cushion between the gas cushion member 332 and the bearing plate 330.

A brake assembly 342 includes one or more brake pins 344, a brake support 346 a seal member 348, and a brake actuator 350. The brake pins 344 are disposed through the second wall 334 of the load lock chamber 104, and through the gas cushion member 332, and can be extended to contact the bearing plate 330. When the brake pins 344 are not in contact with the bearing plate 330, the bearing plate 330 can float on the gas cushion provided by the gas cushion member 332, and can thus move freely in the load lock chamber 104. When the brake pins 344 are extended to contact the bearing plate 330, motion of the bearing plate 330 stops. The brake pins 344 extend from the brake support 346, which may be located outside the load lock chamber 104. Openings 352 in the wall 334 provide passage for the brake pins 344. The seal member 348 maintains a seal around the openings 352. The actuator 350 is coupled to the brake support 346, and may be attached to the second wall 334. The actuator 350 may be a screw actuator, a servo actuator, or another type of actuator commonly used for semiconductor processing chambers.

The alignment assembly 308 includes one or more alignment pins 354 coupled to, or formed as an integral part of, the alignment member 314. The alignment pins 354 project radially inward from an inner edge 358 of the alignment member 314. The alignment member 314 is generally ring-shaped, and may be a ring or a portion of a ring. In one embodiment, the alignment member 314 is a half-ring. Each of the alignment pins 354 has an alignment edge 356 that may contact a substrate disposed on the tips 312 of the pins 310 during an alignment process. Each alignment edge 356 has a first end 360 that is closest to the carrier 318 and a second end 362 that is furthest from the carrier 318. Each alignment edge 356 is closer to a central axis 364 of the load lock chamber 104 at the second end 362 than at the first end 360, so that each alignment edge 356 slopes inward toward the top of the alignment pin 354.

The sloping or tapered configuration of the alignment pins 354 provides a positioning force to move the substrate positioning assembly 306 into a position where the substrate disposed on the tips 312 is in correct alignment when the brake pins 344 are retracted and the substrate positioning assembly 306 is floating on the gas cushion. In order to accomplish the alignment, the alignment assembly 308 may be actuated in an axial direction (i.e. along the axis 364 of the load lock chamber 104) to engage the substrate disposed on the tips 312 while the substrate positioning assembly 306 floats on the gas cushion. The lateral force generated by downward movement of the alignment assembly 308 and the sloping contact of the alignment pins 354 and the substrate aligns the substrate. The brake assembly 342 may then be deployed, the brake pins 344 extended to contact the bearing plate 330, to immobilize the substrate in the aligned position. Operation of the alignment and substrate positioning assemblies will be described further below.

The components of the alignment assembly may be made of any suitable materials for operation in a load lock chamber. Quartz, ceramic, plastic, or metal may be used for the alignment support member and alignment ring. The alignment pins may be made of any material suitable for contacting a substrate. Quartz, silicon, silicon carbide, silicon nitride, or mixtures thereof may be used. The alignment pins may also be made of any convenient material, and then coated with a material suited to contacting a substrate. So, for example, the alignment pins may be made of metal or ceramic that is coated with quartz or silicon nitride.

Figure 3C:
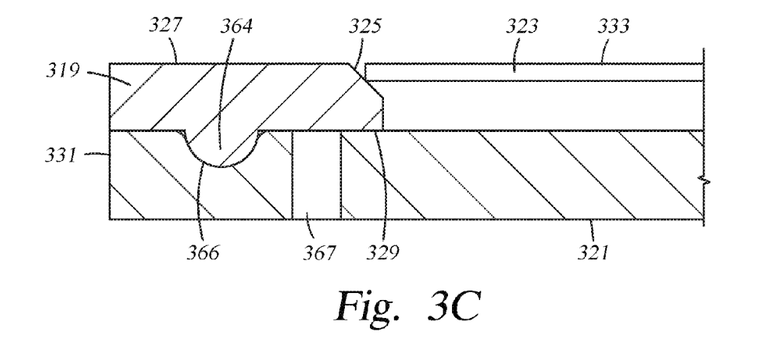
FIG. 3C is a detail view of a portion of a processing chamber according to another embodiment.

FIG. 3B is a detail view of the carrier 318 disposed on the shelf 324. The carrier 318 has a first alignment feature 364 for mating with a second alignment feature 366 of the shelf 324. The alignment features 364 and 366 provide alignment of the carrier 318 in the load lock chamber 104 so that when a substrate is aligned by operation of the alignment assembly 306 and the substrate positioning assembly 308, the carrier 318 can be deployed to contact the substrate in a predictable way. As will be described further below, the carrier 318, with a substrate resting thereon, may be inserted into a processing chamber for processing of the substrate.

Where alignment and positioning of the substrate is important, the alignment features of FIG. 3B may be reproduced in the processing chamber. For example, the processing chambers 108 may be epitaxy chambers in which the substrate support includes a susceptor. The susceptor may include the alignment feature 366 of FIG. 3B for aligning the carrier 318. FIG. 3C is a detailed view of a portion of a processing chamber according to another embodiment. The processing chamber may be one of the processing chambers 108 of FIG. 1. A carrier 319 is shown with a substrate 323 resting thereon. The carrier 319 features a tapered substrate supporting surface 325 to provide minimal contact between the carrier 319 and the substrate 325 without damaging the substrate 325. The carrier 319 is disposed on a susceptor 321 for processing. The alignment features 364 and 366 are formed in the carrier 319 and the susceptor 321 for positioning the carrier 319, and the substrate, in a desired location and orientation in the processing chamber.

The carrier 319 is manipulated in the processing chamber using a lift pin assembly (not shown) with pins that deploy through openings in the susceptor 321. Such an opening is shown at 367. The lift pin extends through the opening 367 and lifts the carrier 319, carrying the substrate 323, above the susceptor 321 such that a robot end-effector can access the carrier 319.

The alignment features 364 and 366 may be a continuous ring-like structure around the entire carrier 318 and shelf 324. The alignment features may be a discontinuous ring-like structure, a series of bumps, a series of elongated bumps, a series of ridges, or the like, with matching features formed in the carrier 318 and the shelf 324. Some embodiments may have one alignment feature, while other embodiments have a plurality of alignment features. In one embodiment, three half spheres are formed along a surface of the carrier 318 at equidistant angular displacements around the extent of the carrier, while three recesses are formed in the shelf 324 (and substrate support of the processing chambers 108) to match. The bumps and ridges referred to above may have a circular profile, as shown in FIG. 3B, or another convenient profile such as triangular, frustroconical, oval, elliptical, and the like. Irregular shapes may also be used.

The carrier may be a carrier ring having an inner diameter that is about 3 to 4 mm smaller than the diameter of the substrate. This would put the thermal discontinuity between the carrier ring and susceptor at the spot where it is most difficult to control the temperature and the film deposition on the substrate.

The carrier may be made of a material that is similar or of the same property to the susceptor. In one embodiment, the carrier is made of silicon coated with SiC or equivalent. The carrier may be circularly symmetric. The circular thermal discontinuity is potentially easier to overcome than a more side to side or a few pin-like intrusions. During operation, the carrier could be made either hotter or colder than the susceptor and could affect the edge of the substrate accordingly, such as counteract the non-uniformity at the edge of the substrate.

The carrier may also be a disc. FIG. 4 is a bottom view of a carrier 400 according to another embodiment. The carrier 400 may be a disc 402 that includes locating features, such as a plurality of protrusions 408, such as three half spheres located on a bottom surface of the carrier 400. The top surface of the susceptor and the top surface of the carrier shelf in the load lock chamber 104 may include corresponding features, such as one spherical pocket and two grooves, for the locating feature of the carrier ring to rest therein. The features on the top surface of the susceptor and the carrier shelf allow for thermal expansion, since one protrusion on the bottom surface of the carrier is placed within the spherical pocket while other two protrusions are placed in the grooves. The locating feature could also come into play as another element in controlling the thermal contact between the carrier and the susceptor.

The carrier 400 may also be a susceptor. In such an embodiment, the components 319 and 321 of FIG. 3C, shown as two separate components, would be one component, which would not have the opening 367. If the carrier 400 is a susceptor, a plurality of recesses 406 may be provided in the bottom surface of the carrier 400 for supporting the carrier 400 in the processing chamber. The recesses 406 may engage the arms of a tripod-style susceptor support, as is known in the art, or the recesses 406 may be shaped to engage any convenient susceptor support. If the carrier 400 is a susceptor, and if the susceptor support has sufficient clearance (as is the case with a tripod-style support), no lift pin assembly is needed in the processing chamber to provide access to the carrier 400 by a robot end-effector. The susceptor support may function like a lift pin assembly, elevating the carrier 400 to a transportation position in the processing chamber while the robot end-effector extends under the carrier 400, and the lowering the carrier 400, with substrate, onto the robot end-effector for transport out of the processing chamber into the load lock chamber. The locating features 408 on the carrier 400 serve to preserve alignment of the carrier 400 on the shelf 324 in the load lock chamber, as described above. A carrier that is also a susceptor may be made of, or coated with, materials useful as susceptor materials in a thermal processing chamber, such as silicon carbide, quartz, and the like. A susceptor carrier may be made of silicon that is coated with silicon carbide.

In one embodiment, the carrier 318 or the carrier 319 is a carrier ring. The carrier 319 of FIG. 3C may include a top surface 327, a bottom surface 329, an outer surface 331, and an inner surface 325. The inner surface 325 may be angled with respect to a top surface 333 of the substrate or the top surface 327 of the carrier ring. The substrate may be placed on the carrier ring in the load lock chamber 104, and only the edge of the substrate is in contact with the inner surface of the carrier ring. The angled inner surface of the carrier ring secures the substrate during operation while the substrate is rotating.

During operation, the carrier 318 or 319 is placed in the load lock chamber 104 (or may be left there from previous processing) on the shelf 324 or other structure that allows a robot to set the carrier and then withdraw the robot arm or end effector. The substrate is then introduced to the load lock chamber by the robot 112 and is placed on the lift pins on a transfer plane that is above the carrier. Again the carrier either has an open center (ring shaped) or pin holes. Then the substrate is aligned to the carrier using the method described above, and the lift pins are lowered to place the substrate on the carrier. Carrier may include an angled inner surface, and only the bottom edge of the substrate is in contact with the inner surface. The robot 110 then picks up the carrier having the substrate disposed thereon and retracts out of the load lock chamber. In this way, the substrate is not in contact with the robot 110, thus eliminating the risk of damaging the substrate during transfer. The robot 110 places the carrier and substrate into one of the processing chambers 108 and onto the lift pins. The back surface of the carrier is in contact with the lift pins. The lift pins are lowered to place the carrier having the substrate disposed thereon onto the susceptor. The carrier functions as part of the susceptor during processing. At the end of the process, such as after an epitaxial layer deposition, the carrier having the substrate disposed thereon is raised by the lift pins and picked up by the robot 110. The robot 110 places the carrier and the substrate into the load lock chamber on the carrier shelf. The lift pins are raised to lift up the substrate off the carrier, and the robot 112 moves the substrate out of the load lock chamber off the lift pins.

Figure 5:
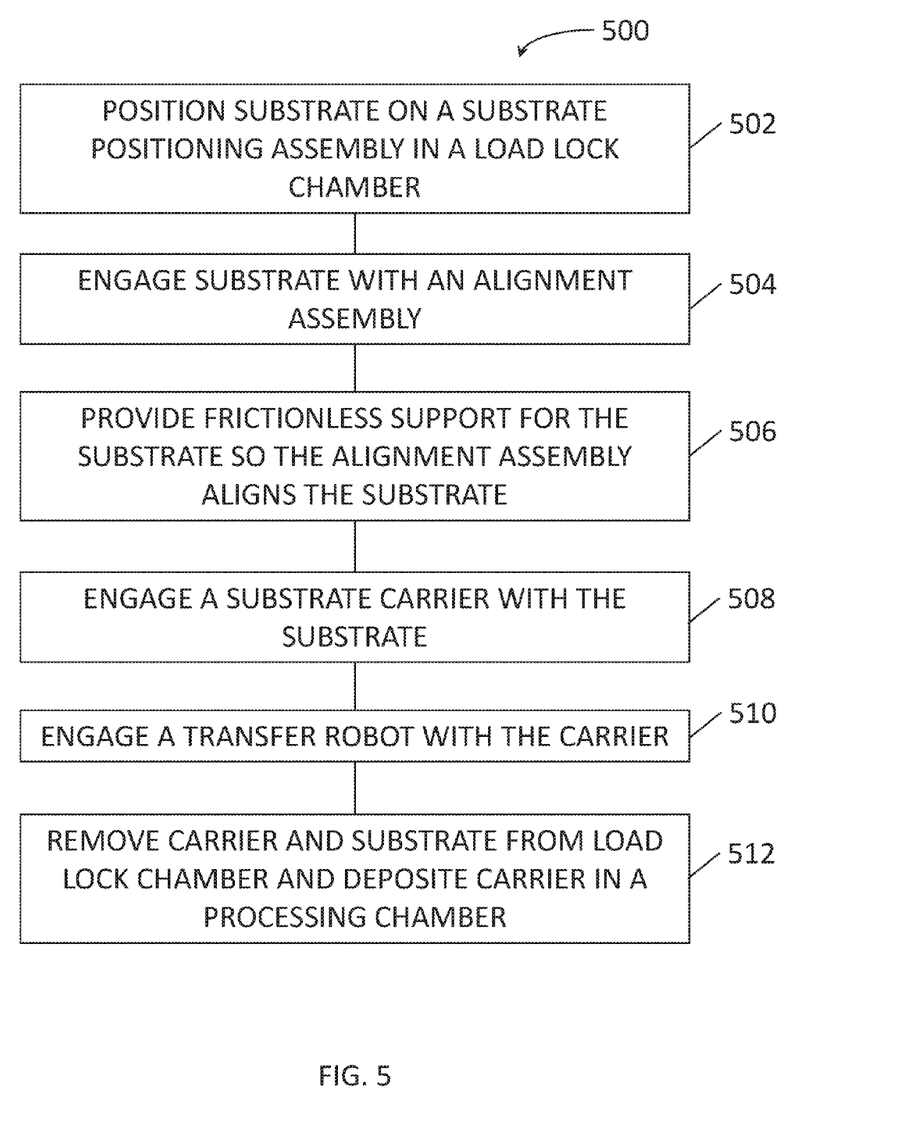
FIG. 5 is a flow diagram summarizing a method according to another embodiment.

FIG. 5 is a flow diagram illustrating a method 500 according to another embodiment. The method 500 is a method of handling a semiconductor substrate. FIGS. 6A-6G are cross-sectional views of the load lock chamber of FIG. 2 in operation performing portions of the method of FIG. 5, and will be described in connection with description of the relevant operations of FIG. 5.

Figure 6A:
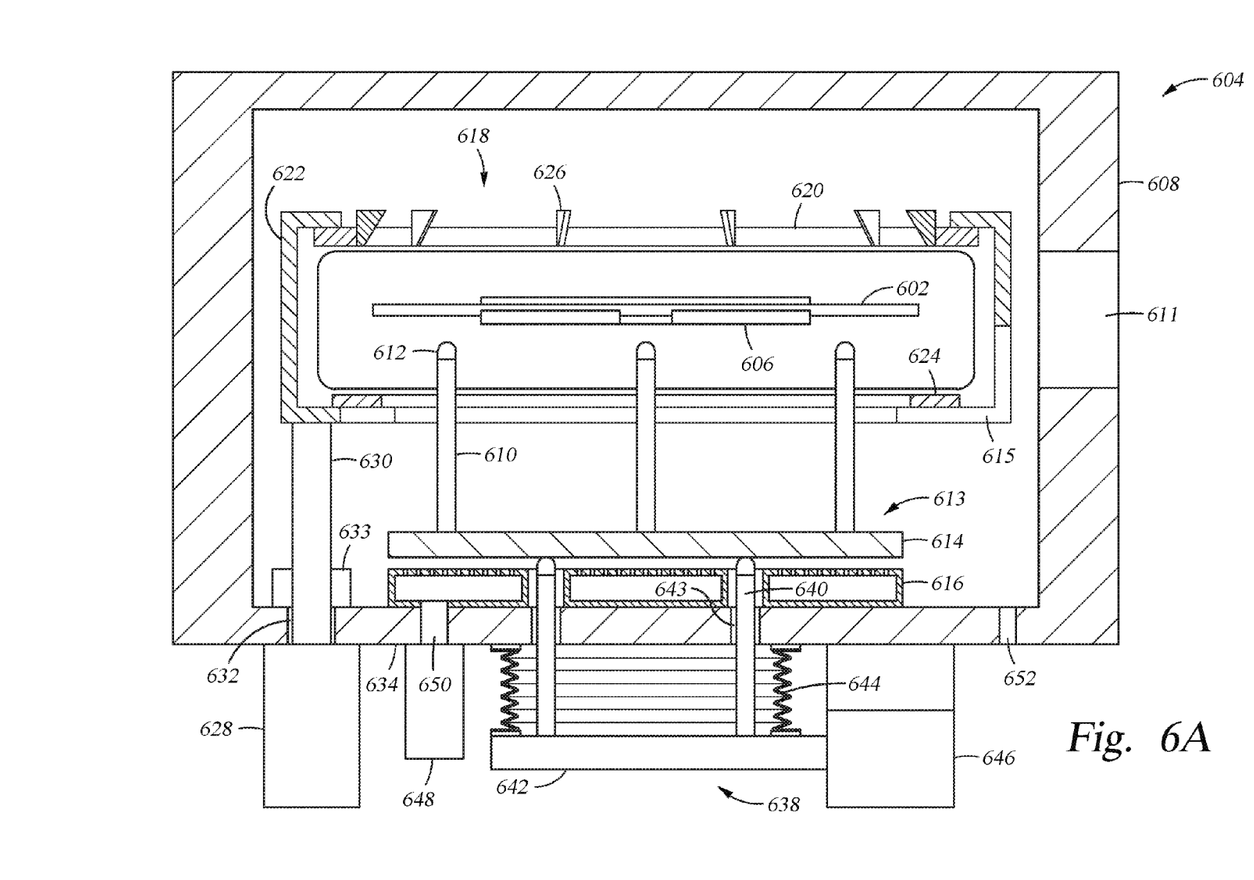
FIGS. 6A-6G are cross-sectional views of the load lock chamber of FIG. 2 in operation performing portions of the method of FIG. 5.
Figure 6B:
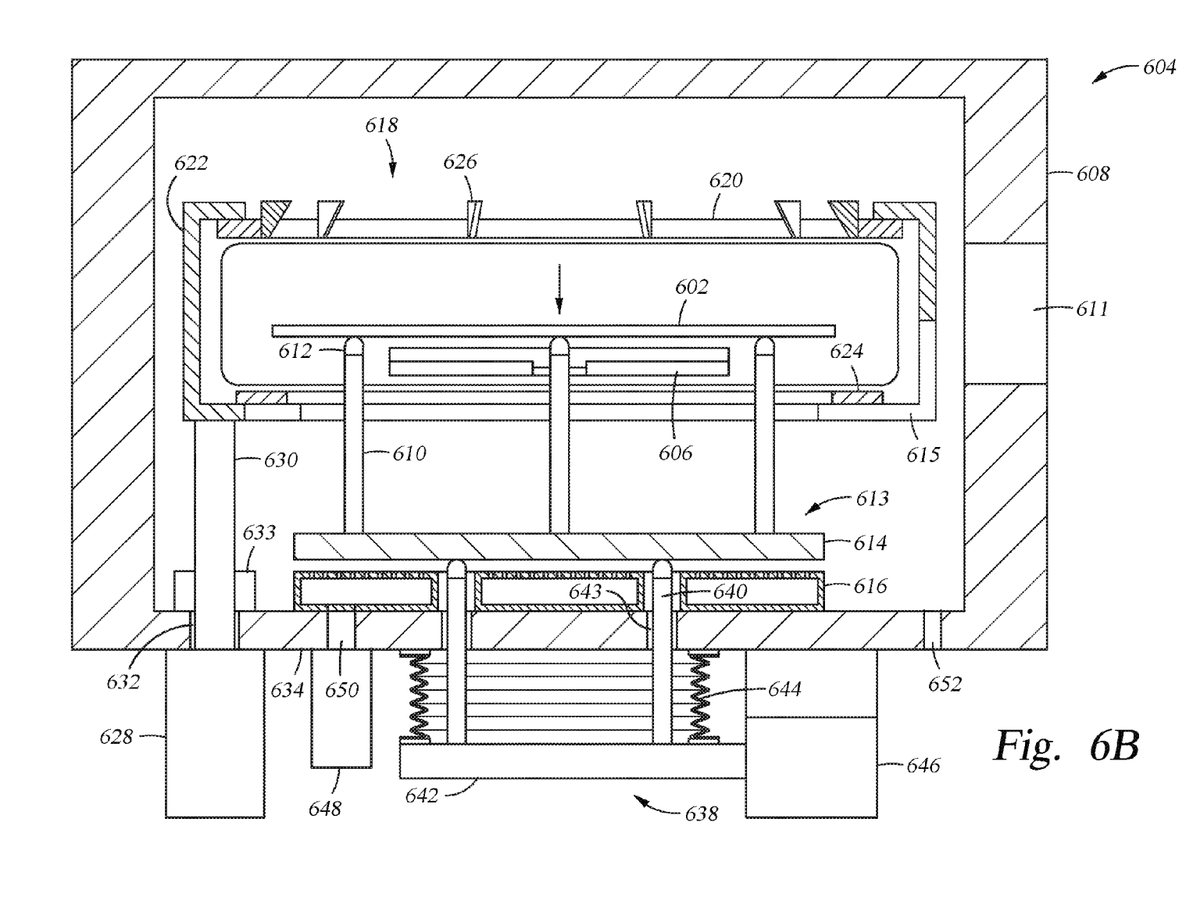

At 502 a substrate is disposed on a substrate positioning assembly in a load lock chamber. As shown in FIG. 6A, a substrate 602 is disposed in a load lock chamber 604. The substrate 602 is carried by a robot end-effector 606 through an opening (not visible in FIG. 6A) in a first wall 608 of the load lock chamber 604. An opening 611 is shown in the first wall 608 for access by a transfer robot to move the substrate from the load lock chamber 604 to a processing chamber, which will be further described below. The substrate 602 is positioned by the robot end-effector 606 over a plurality of substrate support pins 610, which are part of a substrate positioning assembly 613 that includes the pins 610, a bearing plate 614, and a gas cushion member 616. The substrate support pins 610 have soft tips 612 that make direct contact with the substrate 602 without damaging the substrate 602, as described above. As shown in FIG. 6B, the substrate 602 is disposed on the tips 612 of the pins 610, and the robot end-effector 606 disengages the substrate 602 through any combination of movement of the robot end-effector 606 and movement of the pins 610. The pins 610 may move to aid disengaging the substrate 602 from the robot end-effector 606 by operation of the gas cushion member 616. The robot end-effector 606 is withdrawn from the load lock chamber 604.

Figure 6C:
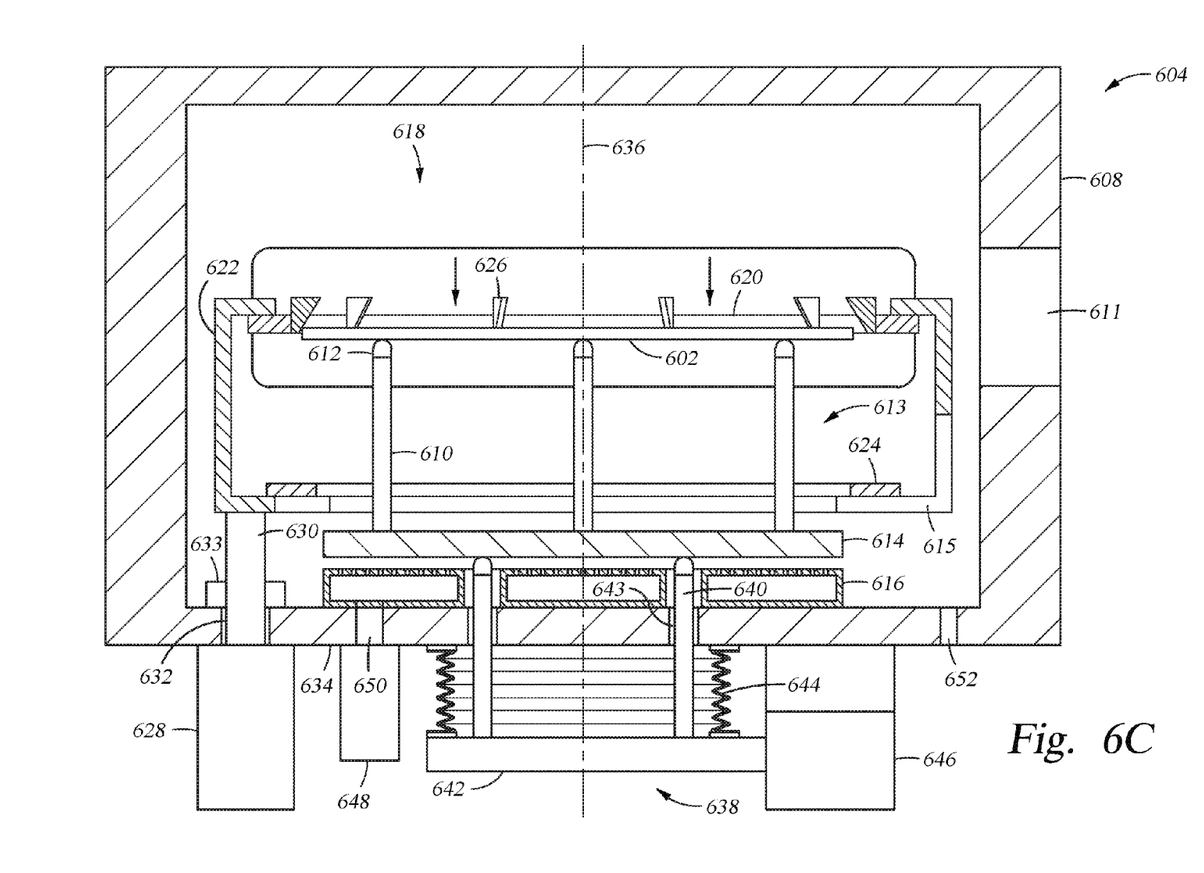

At 504, the substrate is engaged with an alignment assembly. The alignment assembly is part of the load lock chamber. As shown in FIG. 6C, an alignment assembly 618 is provided in the load lock chamber 604 for engaging the substrate 602 resting on the tips 612 of the pins 610. The alignment assembly 618 includes an alignment member 620, and alignment support 622, and a carrier 624. The alignment member 620 includes a plurality of alignment pins 626. The alignment member 620, alignment support 622, and carrier 624 may be as described above. The alignment assembly 618 includes an alignment actuator 628, with a positioner 630 deployed through a first opening 632 in a second wall 634 of the load lock chamber 604. The first opening 632 may be sealed using conventional o-ring configurations around the first opening 632. The alignment actuator 628 moves the positioner 630 linearly, extending and retracting the positioner 630 as needed to move the alignment assembly 618 along an axis 636 of the load lock chamber 604.

In another embodiment, the positioner 630 may be a magnetic positioner, and the actuator 628 may be a magnetic actuator such that the positioner 630 and the actuator 628 are only magnetically coupled and are not directly physically coupled. In such an embodiment, the positioner 630 might not be disposed through an opening in the wall of the chamber body. In such an embodiment, the magnetic actuator has a magnet and the positioner has a magnet that magnetically couples to the magnet in the actuator. When the magnetic actuator moves, the magnet in the positioner maintains magnetic coupling to the actuator and moves with the actuator. In such an embodiment, the magnetic actuator may be located on the side of the chamber body, and may move the external magnet in an axial direction along the side of the chamber body to move the positioner 630 in the axial direction.

Figure 6D:
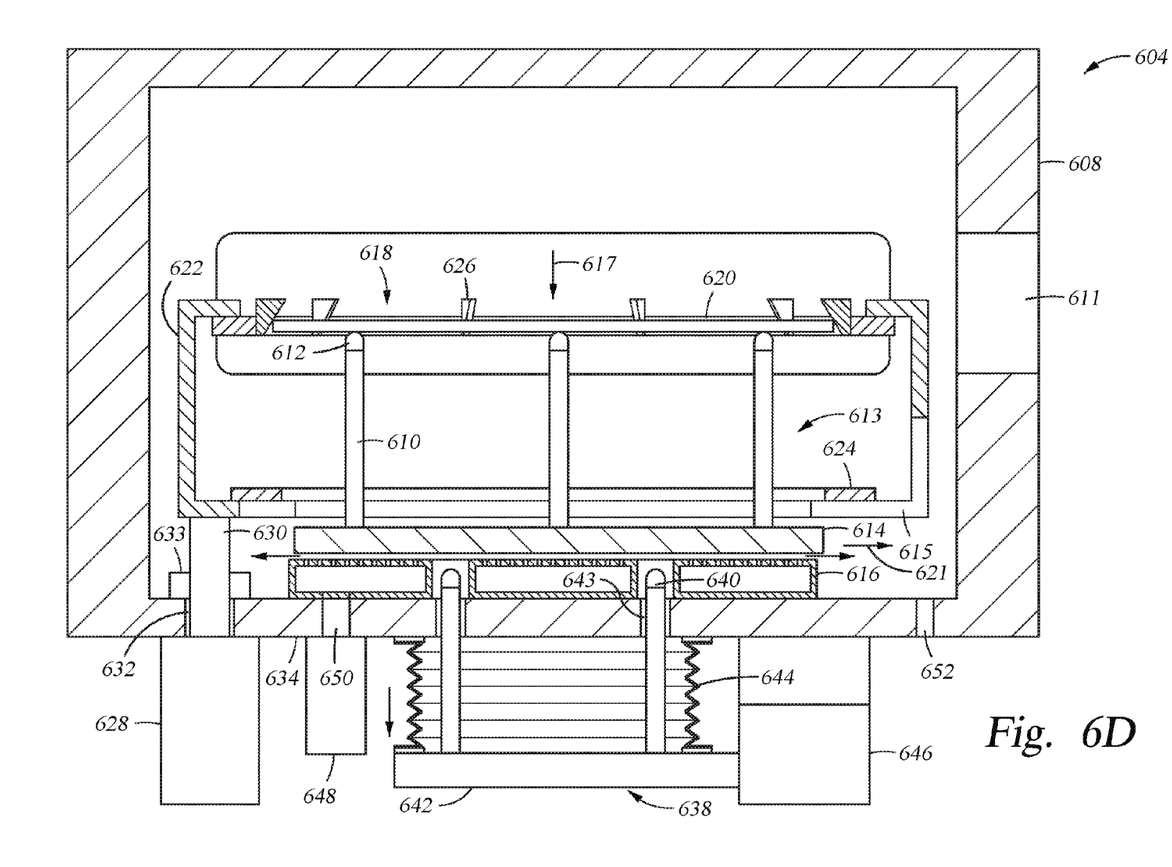

Movement of the alignment assembly 618 brings the alignment pins 626 into contact with the substrate 602 at an alignment position of the alignment assembly 618. At 506, frictionless support is provided for the substrate so that the alignment assembly aligns the substrate. As shown in FIG. 6D, the load lock chamber 604 has a brake assembly 638 that includes a plurality of brake pins 640, a brake support 642, a seal member 644, and a brake actuator 646. As described above, the brake pins 640 are disposed through a plurality of second openings 643 in the second wall 634 of the load lock chamber 604, and through the gas cushion member 616, and can be extended to contact the bearing plate 614. Features and operation of the brake assembly 638 are as described above. Frictionless support is provided to the substrate 602 by operation of the gas cushion member 616. A gas source 648 is fluidly coupled to the gas cushion member 616 through a third opening 650. Gas exits the gas cushion member 616 between the gas cushion member 616 and the bearing plate 616 providing a gas cushion to support the substrate 602 frictionlessly. Gas exits the load lock through a fourth opening 652 in the second wall 634. Although shown as an opening in the second wall 634, gas purge or exit may be provided by any convenient opening in any wall of the load lock chamber 604.

Figure 6E:
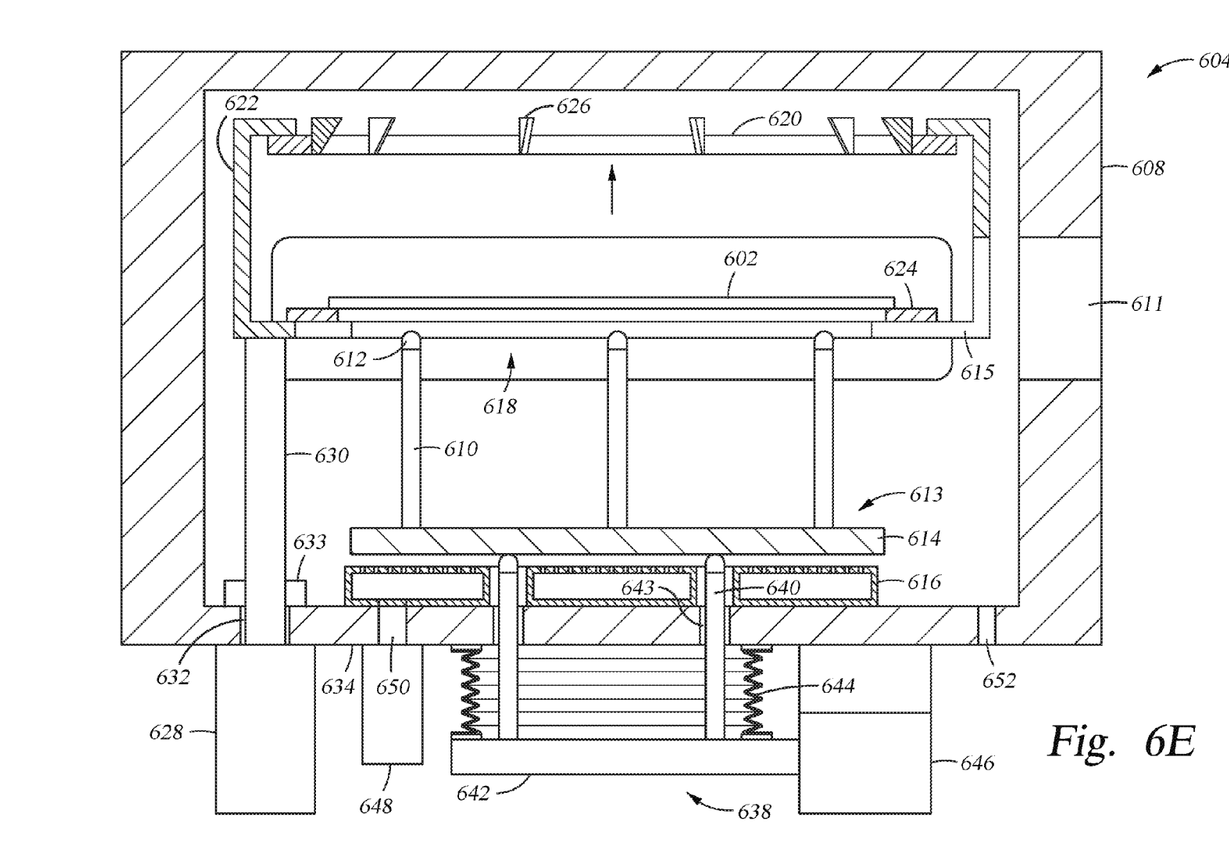

The alignment pins 626 contact the substrate 602 resting on frictionless support by operation of the gas cushion member 616. The sloping edge of the alignment pins 626 convert the axial movement and force of the alignment assembly 618, depicted by arrow 617 and the gas cushion member 616 into a lateral force on the substrate positioning assembly 613, depicted by arrow 621. The substrate positioning assembly 613 moves laterally to equalize the applied lateral forces, thus bringing the substrate 602 into alignment. The brake actuator 646 is then operated to extend the brake pins 640 to engage the bearing plate 614, thus immobilizing the substrate positioning assembly 613 in the aligned position. FIG. 6E shows the brake assembly 638 deployed to immobilize the substrate positioning assembly 613.

The alignment assembly 618 may include an lateral force detector 633 that detects a net lateral force on the positioner 630. As the alignment assembly 618 moves to align the substrate 602, the inertia of the substrate 602 and the substrate positioning assembly 613 may produce a lateral reaction force on the alignment assembly 618 that indicates the substrate 602 has not yet reached the aligned position. The actuator 628 may be controlled to continue moving the alignment assembly 618 toward the substrate positioning assembly 613 to move the substrate 602 toward the aligned position until the substrate 602 contacts enough of the alignment pins 626 to bring the net lateral force on the alignment assembly 618, as detected by the lateral force detector 633, to approximate equilibrium. At that time, the lateral force detector 633 may register an impulse as the alignment assembly 618 stops moving, so the alignment assembly 618 can register that the substrate 602 has reached the aligned position, and the alignment actuator 628 may stop moving the positioner 630, and the brake pins 630 may then be applied. The force detector 633 may be a piezoelectric strain indicator applied to the positioner 630 in some embodiments. Alternately, a stop position of the alignment assembly 618 may be computed from the known geometry of the chamber and the substrate.

At 508, a substrate carrier is engaged with the substrate. The substrate carrier will enable manipulation of the substrate in a processing chamber without direct contact between the substrate and any substrate handling equipment other than the carrier. All contact with substrate handling equipment is absorbed by the carrier. As shown in FIG. 6E, the alignment actuator 628 extends the positioner 630 to move the alignment assembly 618 to a substrate transportation position. Thus, the alignment actuator 628 moves the alignment assembly 618 between a substrate alignment position and a substrate transportation position. The carrier 624 engages the substrate 602, disengaging the substrate 602 from the tips 612. The substrate 602 is correctly aligned with the carrier 624 by operation of the alignment assembly 618 in the alignment operations 504 and 506 above.

Figure 6F:
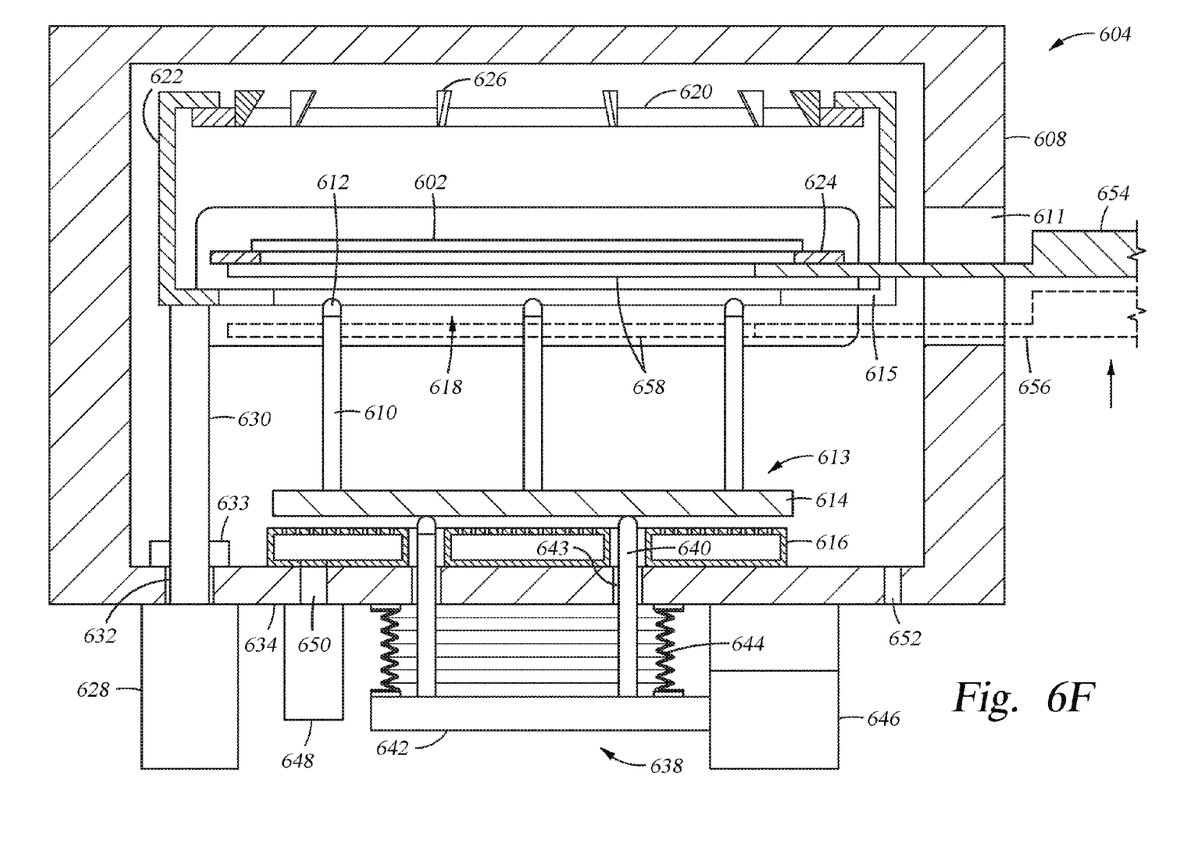

At 510, a transfer robot is engaged with the carrier. As shown in FIG. 6F, a transfer robot 654 enters the load lock chamber 604 through the opening 611 in the first wall 608. The transfer robot 654 may be the robot 110 disposed in the transfer chamber 106 of FIG. 1. The transfer robot 654 enters the load lock chamber 604 at an entry configuration, shown in phantom at 656, to provide unobstructed entry to the load lock chamber 604 through the opening 611 and through an opening 615 in the alignment support 622. Upon reaching a position for engaging the carrier 624, the transfer robot 654 moves to an engagement position, and an end-effector 658 of the transfer robot 654 engages the carrier 624, separating the carrier 624 from the alignment support 622.

Figure 6G:
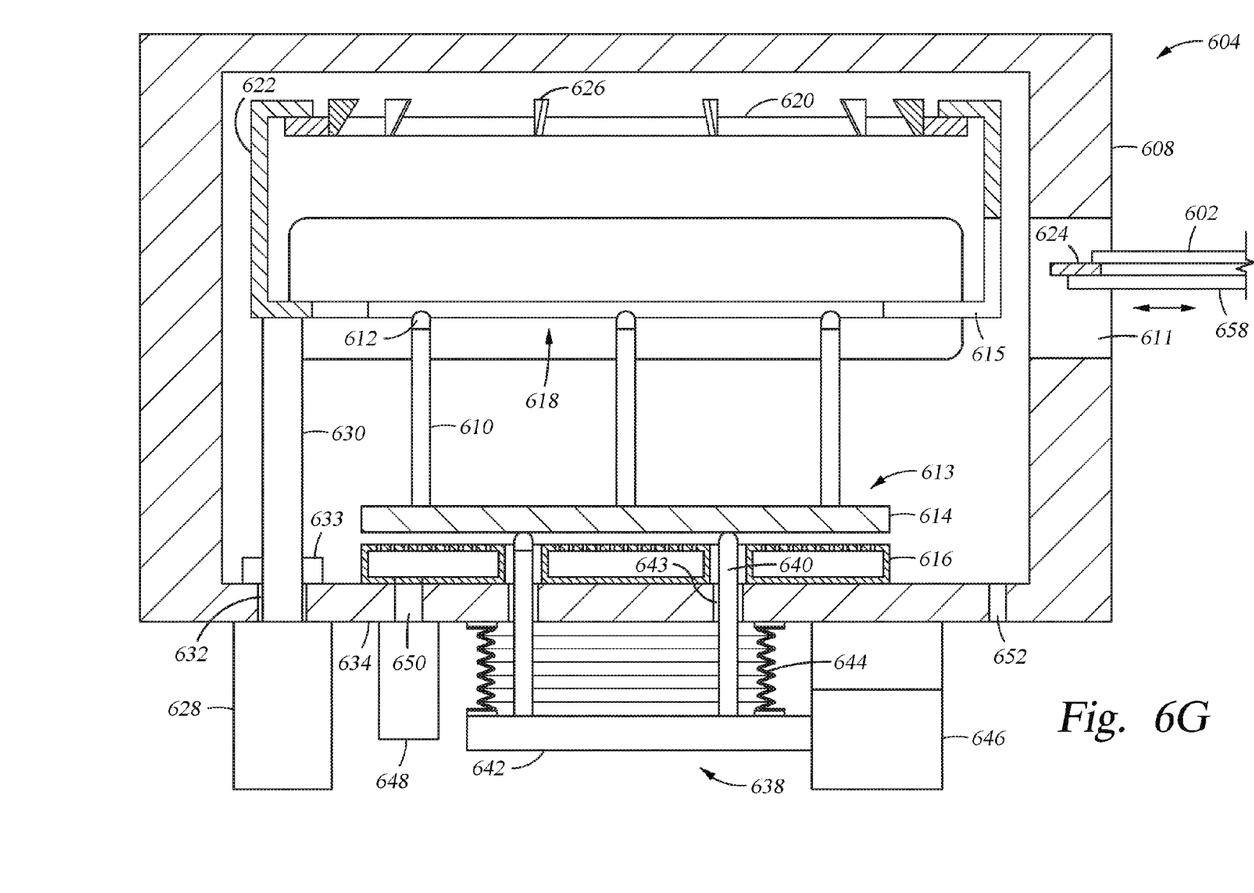

At 512, the carrier and substrate are removed from the load lock chamber and deposited in a processing chamber. The transfer robot 654, bearing the carrier 624 and substrate 602, exits the load lock chamber 604, as shown in FIG. 6G. The transfer robot 654 then enters the processing chamber (not shown) and deposits the carrier 624 in a way that engages the alignment features and/or support features described above in connection with FIGS. 3C and 4. The substrate positioning assembly 613 may be brought to a home position following exit of the substrate and carrier, if desired, through any convenient homing mechanism. In FIG. 6G, the substrate positioning assembly 613 is shown having returned to a home position, and the brake pins 640 are shown in the deployed position to immobilize the substrate positioning assembly 613 at the home position.

While the foregoing is directed to embodiments of the present disclosure, other and further embodiments of the disclosure may be devised without departing from the basic scope thereof, and the scope thereof is determined by the claims that follow.

The invention claimed is:

1. A load lock chamber, comprising:
a chamber body defining an enclosure;
a substrate positioning assembly disposed in the enclosure, the substrate positioning assembly comprising a gas cushion member;
an actuated substrate alignment assembly disposed in the enclosure around the substrate positioning assembly; and
a brake assembly positioned to engage the substrate positioning assembly, wherein the brake assembly comprises:
a plurality of brake pins disposed through a plurality of openings in a wall of the chamber body and coupled to a brake support; and
an actuator coupled to the brake support.

2. The load lock chamber of claim 1, wherein the substrate positioning assembly comprises a bearing plate, a plurality of support pins coupled to the bearing plate, and a gas cushion member positioned to support the bearing plate.

3. The load lock chamber of claim 2, wherein each support pin has a soft tip.

4. The load lock chamber of claim 1, wherein the substrate alignment assembly comprises an alignment support and an alignment member connected to the alignment support.

5. The load lock chamber of claim 4, wherein the alignment support includes an axial portion with a first end and a second end, an extension from the first end that connects the alignment member to the alignment support, and a shelf that extends from the second end.

6. The load lock chamber of claim 5, further comprising a carrier removably disposed on the shelf.

7. The load lock chamber of claim 6, wherein the carrier and the shelf have matching alignment features.

8. The load lock chamber of claim 1, wherein the brake assembly further comprises a seal member disposed around the plurality of openings in the wall.

9. The load lock chamber of claim 1, wherein the substrate alignment assembly comprises an alignment support, an alignment member connected to the alignment support, a positioner coupled to the alignment support, and an actuator coupled to the positioner.

10. The load lock chamber of claim 9, wherein the positioner is disposed through an opening in a wall of the chamber body.

11. The load lock chamber of claim 9, wherein the alignment member is at least a portion of a ring and includes a plurality of alignment pins disposed at an inner radius of the alignment member.

12. The load lock chamber of claim 11, wherein each alignment pin has a sloping inner edge.

13. A load lock chamber, comprising:
a chamber body defining an enclosure;
a substrate positioning assembly disposed in the enclosure, the substrate positioning assembly comprising a gas cushion member;
an actuated substrate alignment assembly disposed in the enclosure around the substrate positioning assembly, the substrate alignment assembly comprising:
an alignment support; and
an alignment member connected to the alignment support, the alignment member having an inner radius and a plurality of alignment pins disposed at the inner radius; and a brake assembly positioned to engage the substrate positioning assembly, wherein the brake assembly comprises:
  a plurality of brake pins disposed through a plurality of openings in a wall of the chamber body and coupled to a brake support;
  an actuator coupled to the brake support; and
  a seal member disposed around the plurality of openings.

14. The load lock chamber of claim 13, wherein the substrate positioning assembly comprises a bearing plate, a plurality of support pins coupled to the bearing plate, each of the support pins having a soft tip, and a gas cushion member positioned to support the bearing plate.

15. The load lock chamber of claim 13, wherein the alignment assembly is actuated to move between a substrate alignment position and a substrate transportation position.

16. The load lock chamber of claim 13, wherein the substrate alignment assembly further comprises:
  a positioner coupled to the alignment support;
  a linear actuator coupled to the positioner; and
  a lateral force detector coupled to the positioner.

17. A load lock chamber, comprising:
  a chamber body defining an enclosure;
  a substrate positioning assembly disposed in the enclosure, the substrate positioning assembly comprising a plurality of support pins having soft tips, a bearing plate coupled to the plurality of pins, and a gas cushion positioned to support the bearing plate;
  an actuated substrate alignment assembly disposed in the enclosure around the substrate positioning assembly, the substrate alignment assembly comprising:
    an alignment support having an axial portion, a first extension at a first end of the axial portion, and a shelf at a second end of the axial portion; and
    an alignment member connected to the alignment support by the first extension, the alignment member having an inner radius and a plurality of alignment pins disposed at the inner radius, each alignment pin having a sloping inner edge;
    a positioner coupled to the alignment support; and
    an actuator coupled to the positioner; and
  a brake assembly positioned to engage the substrate positioning assembly, the brake assembly comprising a plurality of brake pins disposed through a plurality of openings in a wall of the chamber body and coupled to a brake support, an actuator coupled to the brake support, and a seal member disposed around the plurality of openings.

18. The load lock chamber of claim 17, further comprising a carrier removably disposed on the shelf.

* * * * *